United States Patent
Loduha et al.

(10) Patent No.: US 9,457,277 B2
(45) Date of Patent: Oct. 4, 2016

(54) MULTI-SOLVER PHYSICS ENGINE

(71) Applicants: Tim Loduha, Milwaukee, WI (US);
Kevin Kaichuan He, San Jose, CA (US); David Baszucki, Portola Valley, CA (US)

(72) Inventors: Tim Loduha, Milwaukee, WI (US);
Kevin Kaichuan He, San Jose, CA (US); David Baszucki, Portola Valley, CA (US)

(73) Assignee: Roblox Corporation, San Mateo, CA (US)

(*) Notice: Subject to any disclaimer, the term of this patent is extended or adjusted under 35 U.S.C. 154(b) by 418 days.

(21) Appl. No.: 13/905,989

(22) Filed: May 30, 2013

(65) Prior Publication Data

US 2014/0354694 A1    Dec. 4, 2014

(51) Int. Cl.
*G06T 3/00* (2006.01)
*A63F 13/573* (2014.01)
*G06T 13/00* (2011.01)
*G06F 17/50* (2006.01)
*A63F 13/56* (2014.01)
*A63F 13/577* (2014.01)

(52) U.S. Cl.
CPC ............. *A63F 13/573* (2014.09); *A63F 13/56* (2014.09); *A63F 13/577* (2014.09); *G06F 17/5009* (2013.01); *G06T 13/00* (2013.01); *A63F 2300/663* (2013.01); *A63F 2300/6607* (2013.01); *A63F 2300/6623* (2013.01); *A63F 2300/6638* (2013.01)

(58) Field of Classification Search
None
See application file for complete search history.

(56) References Cited

U.S. PATENT DOCUMENTS

| | | | | |
|---|---|---|---|---|
| 6,125,385 A * | 9/2000 | Wies | ........................ | G06F 3/016 345/163 |
| 7,640,221 B2 * | 12/2009 | Baum | ........................ | G06N 5/00 706/45 |
| 2004/0036711 A1 * | 2/2004 | Anderson | ..................... | 345/701 |
| 2006/0149516 A1 * | 7/2006 | Bond et al. | ........................ | 703/6 |
| 2009/0083015 A1 * | 3/2009 | McDaniel | ........................ | 703/6 |
| 2009/0099824 A1 * | 4/2009 | Falash et al. | ..................... | 703/8 |
| 2010/0029384 A1 * | 2/2010 | Andersen et al. | .............. | 463/32 |
| 2010/0134501 A1 * | 6/2010 | Lowe et al. | .................. | 345/474 |
| 2013/0222433 A1 * | 8/2013 | Chapman | ................ | G06T 13/40 345/660 |

* cited by examiner

*Primary Examiner* — Sultana M Zalalee
(74) *Attorney, Agent, or Firm* — Donald R. Boys; Central Coast Patent Agency, Inc.

(57) ABSTRACT

A method has steps tracking states for objects in a virtual world by software (SW) executed by a processor from a non-transitory physical medium, noting that physics simulation is necessary to determine a change in display for a particular object, noting characteristics of the particular object, selecting from a plurality of modules, a specific physics simulation module optimized for objects having the characteristics of the particular object, and applying the physics simulation module selected to determine display change for the particular object.

6 Claims, 4 Drawing Sheets

MULTI-SOLVER PHYSICS ENGINE

BACKGROUND OF THE INVENTION

1. Field of the Invention

The present application is in the technical area of virtual worlds, and pertains more particularly to physics simulation for dynamic objects.

2. Description of Related Art

In video games based on defined virtual worlds it is well known to define objects that may move in a display, and to simulate interaction of those objects with other elements in the display, both moving and not moving. For example, a very early game displayed a ball, like a ping-pong ball, moving on the display screen, and the ball would be seen to rebound at the edges of the display screen. This is a very simple example of physics simulation, the object being to display the movements of the ball and the reactions of the ball with perceived walls (the edges of the screen), to make the display of the ball movement as real as practical. In this early example the ball, however, moved in straight lines, and there was no simulation of effects of gravity, which would have caused the ball to have curved trajectories.

In the evolution of video games the processes of physics simulation have become, as of the time of the present patent application, quite sophisticated. Video games no include characters often termed avatars, which a player may cause to move in the game display and interact with numerous other objects and elements, and also rather complicated vehicles (aircraft, ground machines) that may be operated, and which may interact with avatars, landscape elements, and other dynamic elements in a game.

Physics simulation in management of a video game or other renditions of virtual worlds takes into account preprogrammed and determined facts about elements in a game, such as size, surfaces, mass, velocity at a point in time, and other information, and uses algorithms largely based on Newton's Laws of Motion to determine the reaction of the elements considered in interactions with other elements. The reactions are applied to display of further movement of the elements and other effects, like an element breaking of coming apart.

It is well-known that there is a close relationship between appearance of reality in display of a virtual world with dynamic effects and the variety and degrees of freedom of elements in the world. As the world becomes more and more complicated, maintaining a semblance of reality takes more and more computer power and memory.

Given the above relationships it is clear that any way that more complexity may be achieved with displays that appear real, without commensurate increases in computer power and memory is to be highly desired. Improvements in embodiments of the present invention provide such benefits at minimal cost.

BRIEF SUMMARY OF THE INVENTION

In one embodiment of the invention a method is provided, comprising tracking states for objects in a virtual world by software (SW) executed by a processor from a non-transitory physical medium, noting that physics simulation is necessary to determine a change in display for a particular object, noting characteristics of the particular object, selecting from a plurality of modules, a specific physics simulation module optimized for objects having the characteristics of the particular object, and applying the physics simulation module selected to determine display change for the particular object.

In one embodiment the method further comprises continuing to apply the specific physics simulation module to the particular object until simulated forces are balanced indicating no further change in display is needed. Also in one embodiment the method further comprises noting that two or more objects are on point of interaction, noting characteristics of the two or more objects, and selecting and applying specific physics simulation modules optimized for objects having the characteristics noted.

Also in one embodiment the method further comprises noting by the SW that one or more results of computation regarding one particular object are needed for computation regarding another particular object, and providing communication between the two particular objects to satisfy the need. Still in one embodiment the method further comprises providing a physics simulation module for selection optimized for objects comprising elements joined by pivotal connections. Also in one embodiment the method further comprises providing a physics simulation module for selection optimized for collections of material behaving like liquid.

In some embodiments a physics simulation module is provided for selection optimized for objects characterizing humanoid figures. In another embodiment a physics simulation module is provided optimized for objects floating in water. In yet another embodiment a physics simulation module is provided optimized for objects floating in water. In yet another embodiment a physics simulation module is provided optimized for single, large rigid objects. In another embodiment of the invention a physics simulation module is provided for selection, optimized for weapons firing cartridges and shells.

In another aspect of the invention an apparatus is provided comprising a computerized appliance having a processor executing coded instructions from a non-transitory medium, the coded instruction causing the apparatus to perform a process comprising tracking states for objects in a virtual world by software (SW) executed by a processor from a non-transitory physical medium, noting that physics simulation is necessary to determine a change in display for a particular object, noting characteristics of the particular object, selecting from a plurality of modules, a specific physics simulation module optimized for objects having the characteristics of the particular object, and applying the physics simulation module selected to determine display change for the particular object.

In one embodiment the apparatus further comprises continuing to apply the specific physics simulation module to the particular object until simulated forces are balanced indicating no further change in display is needed. Also in one embodiment the apparatus further comprises noting that two or more objects are on point of interaction, noting characteristics of the two or more objects, and selecting and applying specific physics simulation modules optimized for objects having the characteristics noted.

Still in one embodiment the apparatus further comprises noting by the SW that one or more results of computation regarding one particular object are needed for computation regarding another particular object, and providing communication between the two particular objects to satisfy the need. Still in one embodiment the apparatus further comprises providing a physics simulation module for selection optimized for objects comprising elements joined by pivotal connections.

In some embodiment a physics simulation module is provided for selection optimized for collections of material behaving like liquid. Also in some embodiments a physics simulation module is provided for selection optimized for objects characterizing humanoid figures. Also in some embodiments a physics simulation module is provided for selection optimized for objects floating in water. Still in some embodiments a physics simulation module is provided for selection optimized for single, large rigid objects. Also in one embodiment a physics simulation module is provided for selection optimized for weapons firing cartridges and shells.

DETAILED DESCRIPTION OF THE INVENTION

Figure 1:
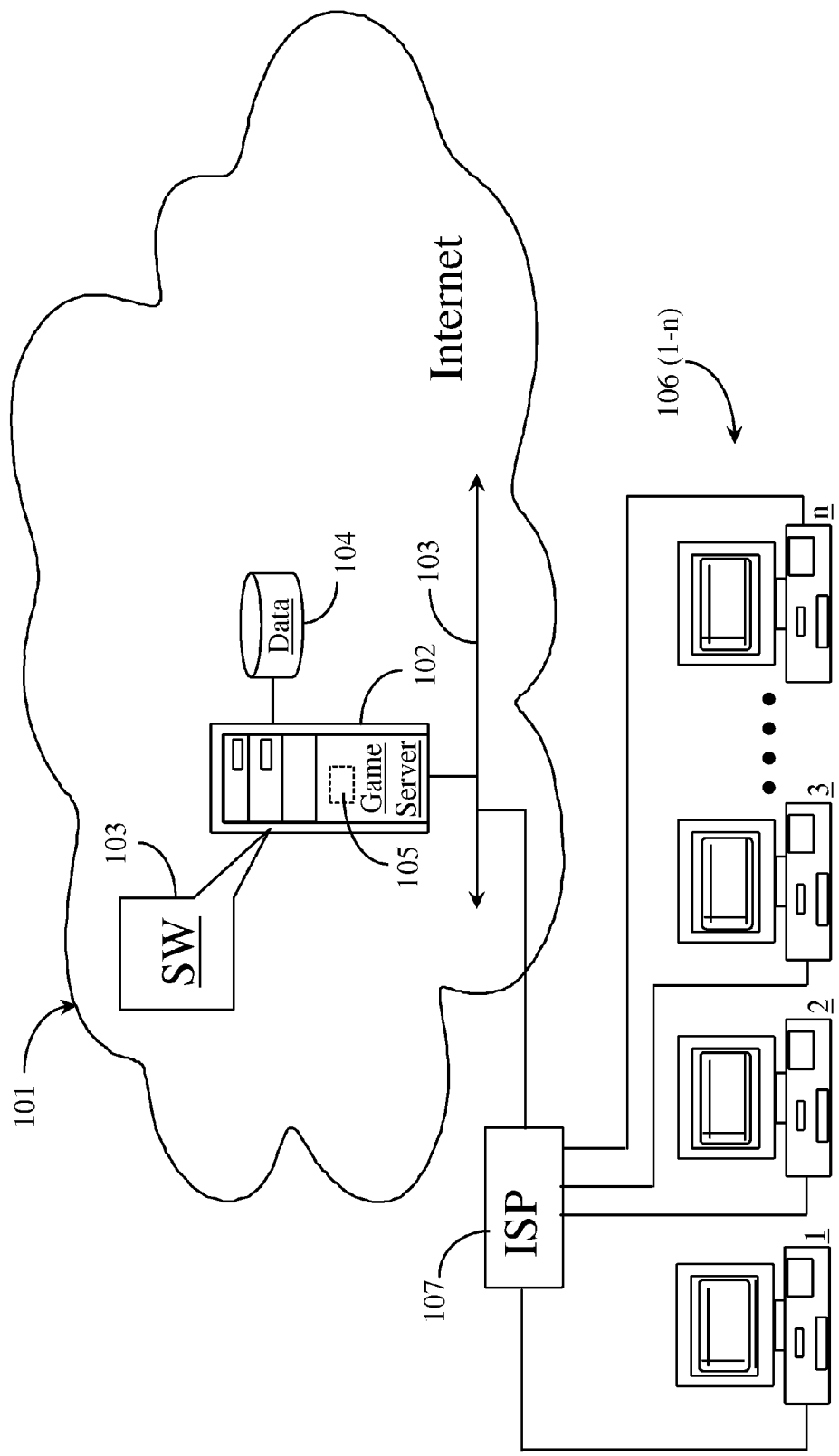
FIG. 1 is an architecture diagram showing an arrangement useful for practicing embodiments of the present invention.

FIG. 1 is a diagram illustrating a generalized architecture over which video games may be displayed and played in embodiments of the present invention. At least one game server 102 having at least one processor 105 executing software (SW) 103 executing from a non-transitory storage medium 104 is connected in the Internet network to Internet backbone 103, which path represents all of the myriad interconnections in the Internet. Client computerized appliances 106 (1-n) each connect to Internet backbone 103 through one or another Internet Service Provider (ISP) 107, and may connect thusly to game server 102. ISP 107 is representative of all the ways appliances capable of playing video games may connect to the Internet.

Game server 102 may provide one or more pages wherein clients using appliances 106 may select and play one or another video game. Upon selection and initiation game server 102 through SW 103 may provide a display for the client on a display screen of the client's appliance, enabling the client to interact with objects of the game, and server 102 through SW 103 may update the client's game display as play continues. In embodiments of the present invention such games may have numerous dynamic elements that interact with players and interact with one another, and SW 103 may include one or more physics engines for considering properties of game elements, and determining parameters effecting display of these elements in frames of the video game in play. More detail about physics engines and application of such engines in embodiments of the present invention is provided in description of embodiments below.

Figure 2:
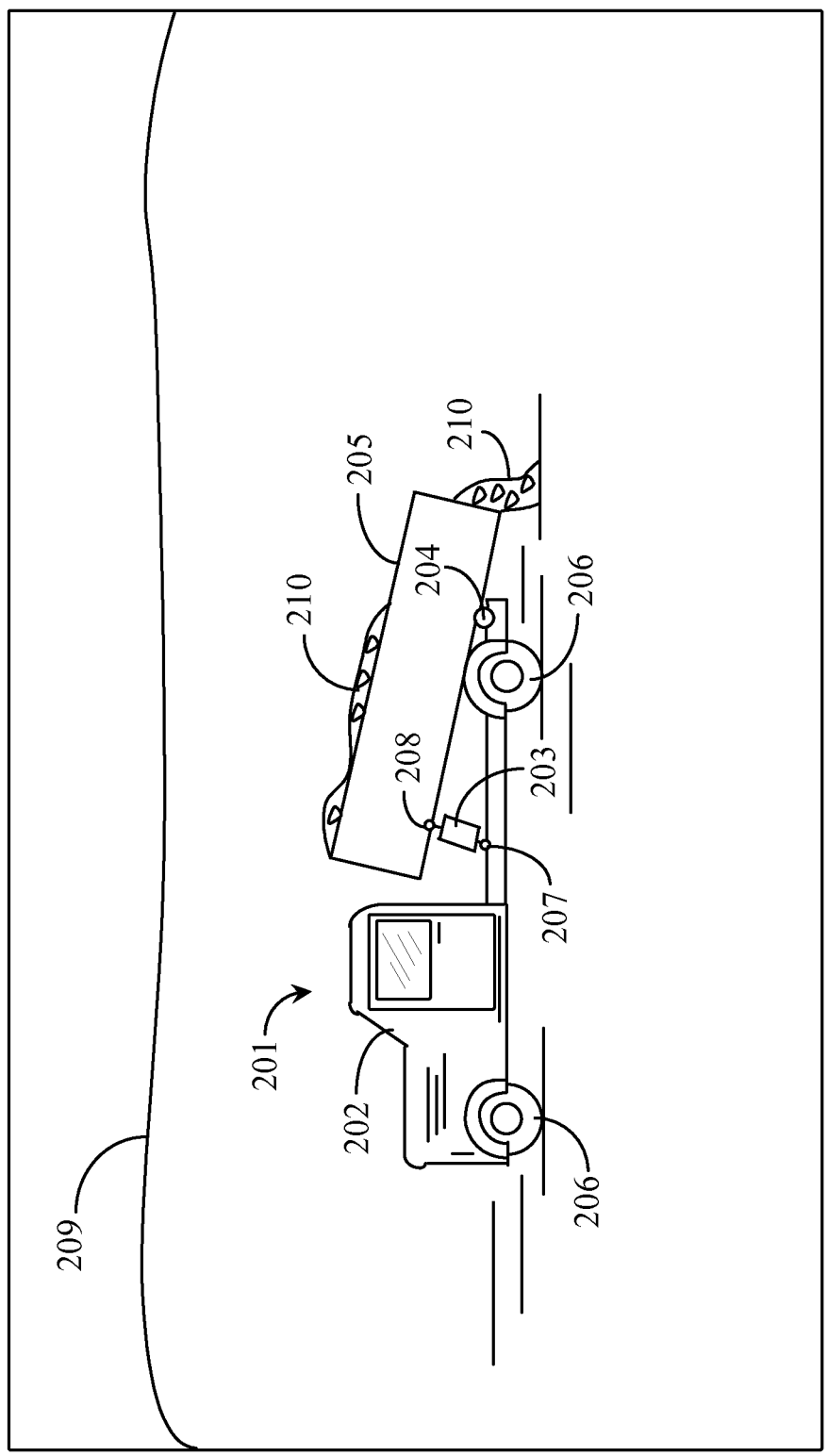
FIG. 2 is an illustration of a display 201 of at least a portion of a video game in a single frame in an embodiment of the present invention.

FIG. 2 is an example of a display of at least a portion of a video game in a single frame in an embodiment of the present invention, showing a dump truck 201 with a load of gravel 210. This depiction is rather more simplistic than one would see in an actual frame of such a video game, which might depict one or more avatars, landscape elements and other movable and moving objects. Further, in a well-developed frame of a game the dump truck may be shown in perspective in three-dimensions instead of two-dimensions as shown in FIG. 2. The simplification is intentional to be able to focus on a description that will explain principles of the invention in one embodiment.

Dump truck 201 has a cab portion 202, wheels 206, a truck bed 205 that may rotate about a pivot 204, and an hydraulic cylinder 203 anchored at pivot points 207 and 208 which a user may operate to extend or retract to tilt truck bed 205 around pivot 204. Line 209 is an horizon line. Truck bed 205 has a load of gravel 210 which may be caused to exit the truck bed as the bed is caused to tilt to a steeper angle with the horizontal. The truck bed is shown tilted to a shallow angle and gravel 210 is shown exiting the truck bed to form a pile on the ground.

In the frame shown in FIG. 2 there is considerable information (data) that may be stored in database 104 (FIG. 1), determined from previous frames and activity, and accessible to SW 103 for consideration to determine movement of elements for rendering in the next and future frames of the video game. Truck 201 is a sort of object that is an assembly of a number of other objects that are joined together in some cases by rigid connections, and in some cases by rotating joints, such as the rotating joint around which the truck bed may tilt. This fact is recorded in the database and is known to the SW.

Further to the above, the truck may be stationary or moving forward or in reverse along the ground. The truck, if moving, may be accelerating or decelerating, which will impose forces on the tuck and the gravel 210 load in the bed of the truck. A player may be causing the bed of the truck to tilt more or less, and that tilt, if evident, may have a rate that may be accelerating or decelerating. Further, the degree of tilt at any point is known.

The load of gravel in the truck bed is an object (collection of objects) of an entirely different sort than the truck. The load of gravel may be considered a single object made up of a very large number of smaller objects (pieces of gravel) that are joined by contact connection, which may be easily broken.

Most video games in conventional art use a single physics engine for determining movement under various circumstances for all of the movable objects in a game. So in most conventional cases the one physics engine will be utilized to calculate for the truck and also for the load of gravel.

It might be clear to the skilled person that a physics engine developed to determine movement of elements of the truck might well be very inefficient for determining movement of the gravel load, and the opposite is true as well.

In an embodiment of the present invention there are number of different modules in the physics engine, one of which may be optimal for determining the movement of elements of the truck, which are mostly rotation about pivot joints. Another module is optimized for treating a load of gravel, for example, as a viscous slurry. In embodiments of the present invention a filter in the SW, at the point in time that it is considered to be necessary to determine movement of elements in the display for rendering another frame, considers the properties of the objects or assemblies for which physics calculations must be made, and chooses the most optimal physics engine module to apply for each object or portion of an object.

Figure 3:
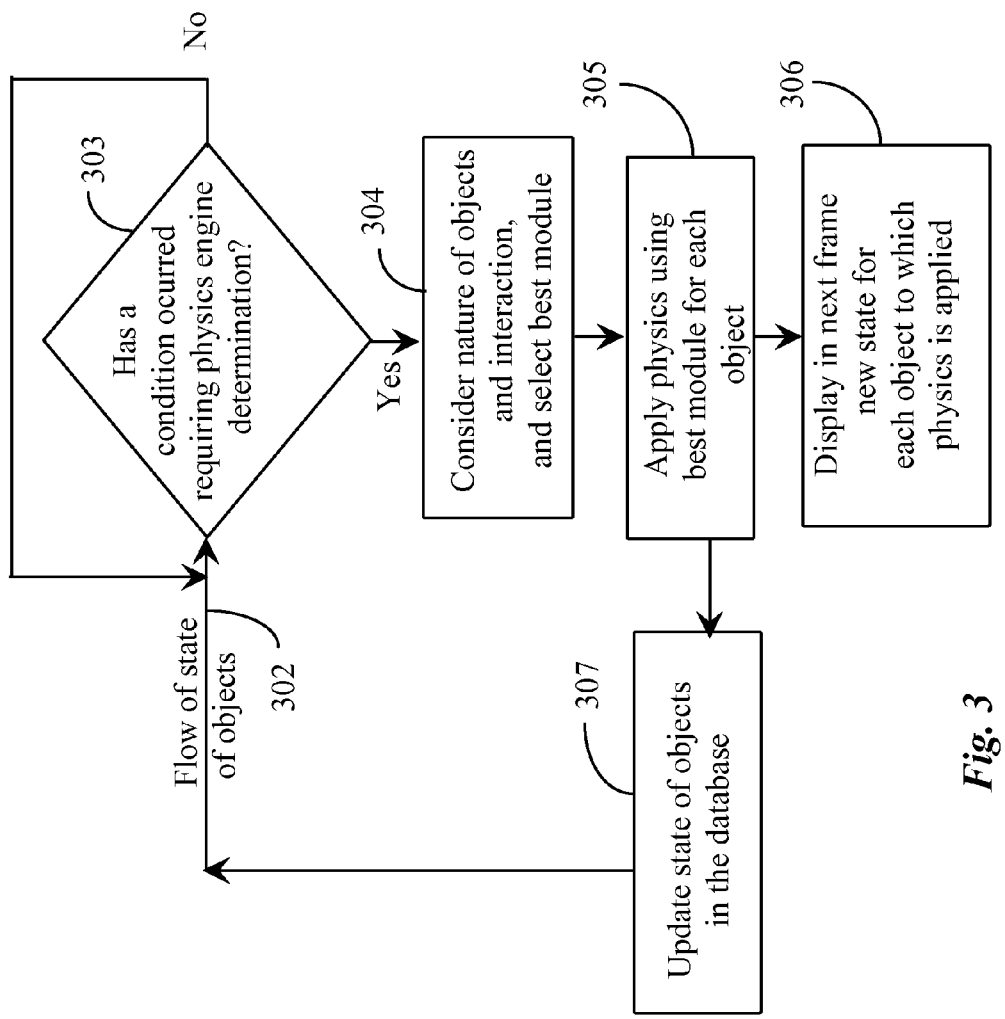
FIG. 3 is a flow diagram depicting steps in determining changes in state for objects in an embodiment of the invention.

FIG. 3 is a flow diagram depicting steps in determining changes in state for objects in an embodiment of the invention. A filter introduced above, operating as a part of SW 103 is largely implemented in step 303 of FIG. 3. A flow of object states, indicated by arrow 302 as time passes is accessible by the filter in step 303, and the filter determines when a condition has occurred requiring application of one or more physics algorithms to determine a new state for the object or objects under consideration. In each iteration, which may be the frame period, but may be more or less often, if no condition requiring calculation has occurred, control goes back to flow 302.

If a condition requiring update is recognized in step 303, the system, through the filter mechanisms, considers at step 304 the nature of the objects for which determination is needed, and in many cases, also the nature of interaction between objects. The condition, for example, may be a collision between two rigid objects, may be an input by a player to cause a movement or other action, or may be, as indicated in FIG. 2, a new state for the truck bed that requires a new state for the gravel slurry carried in the truck bed. As a result of the consideration the system determines the optimum physics module for each determination. It may be determined that the truck bed has achieved a greater tilt angle. The system will apply at step 305 one module optimized for assembled objects having pivot connections to determine a new state for the truck and the truck bed, and will apply a different module to the gravel slurry to determine the flow of the gravel from the truck bed, and the collection of a pile of gravel on the ground behind the truck.

At step 306 the system renders data for a graphics system to update the display in the next frame for objects for which the display state has changed. At step 307 the system updates the state of objects in the database for which state has changed, and the new state for the objects becomes a part of the flow of state of objects back into the filter at step 303.

The description thus far has concentrated on the modular nature of physics modules in the unique physics engine in embodiments of the present invention. Although these modules are separate and separately selected and used, there are situations in which some interaction between modules may be necessary. That is, in considering forces and other conditions on one object or assembly of objects, there may be instant ramifications for calculation for another object or assembly of objects. The situation of the dump truck and the gravel slurry in the bed of the truck may serve to explain this situation.

Figure 4:
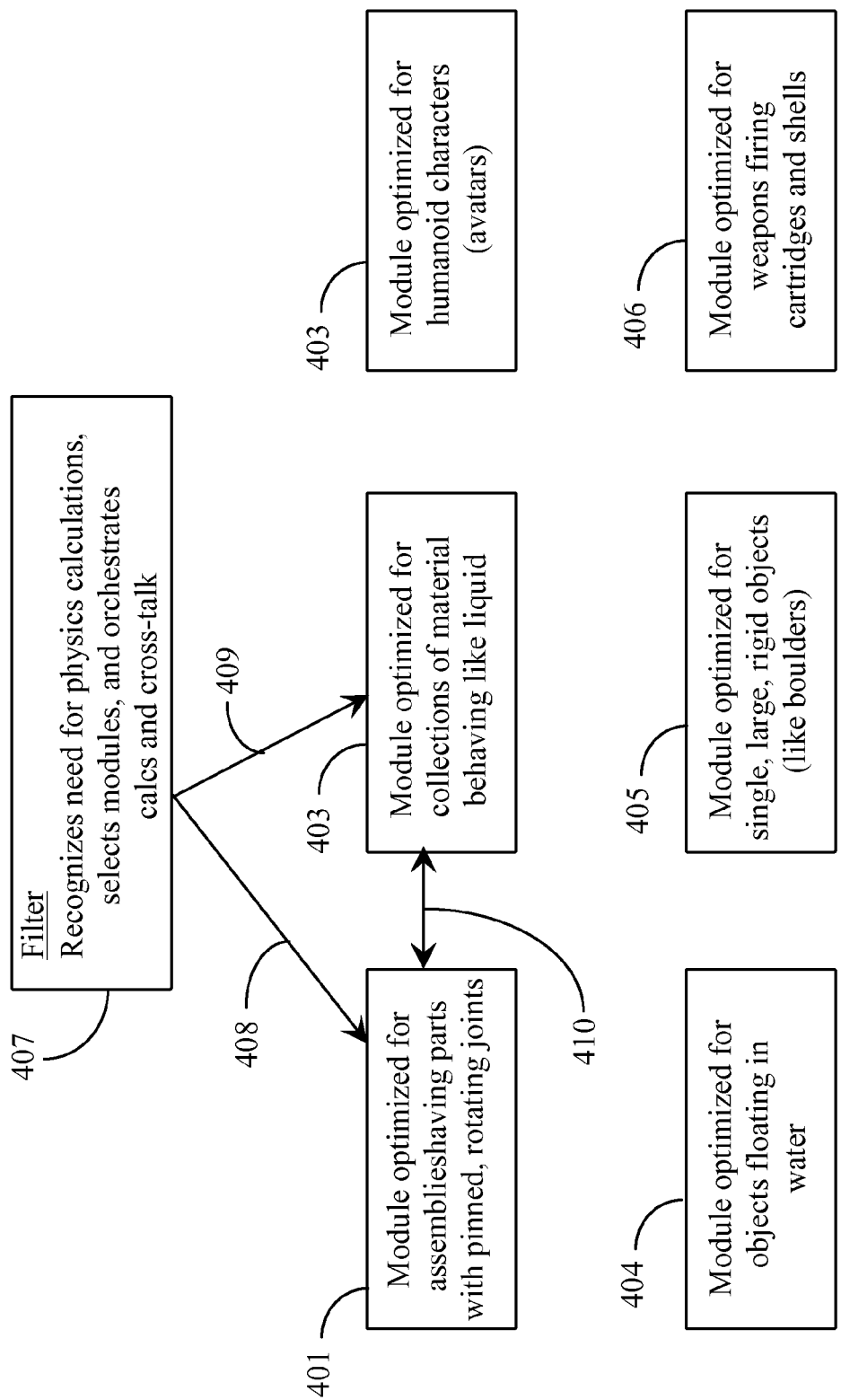
FIG. 4 is a depiction of several different physics modules useful for different kinds of objects or assemblies of objects

FIG. 4 is a diagram showing several different physics computation modules optimized for different kinds of objects or assemblies of objects, and a representation of the filter module 407 that orchestrates selection of modules at need. Module 401 is optimized for assemblies having parts with pinned, rotating joints, like the dump truck described above. Many other assemblies may also have parts pinned by rotating joints. Module 403 is optimized for collections of material like the gravel load described above, that may behave like viscous slurry. Module 403 is optimized for applying physics principles to humanoid characters. Module 404 is optimized for calculating behavior of objects floating or submerged in water, and takes buoyancy into account. Module 405 is optimized for applying physics principles to singular large objects, like boulders, that may be dislodged and moved in the virtual world, such as by rolling down a slope, and this may interact with other objects. Module 406 is optimized for calculations involving weapons that fire shells or projectiles, and calculates trajectories.

It is to be noted that the several modules named and described herein is not a limitation to the number, types, or calculating characteristics of modules that might exist and be used in different embodiments of the present invention. These modules are exemplary.

Returning now to FIG. 2 showing the dump truck with the load of gravel, filter 407 in FIG. 4 has noted by tracking the flow of object states in the virtual world that there is a need for calculation for dump truck 201 and gravel load 210. This may be because, for example, a player has caused the tilt of the bed of the truck to incline to a greater degree. Filter 407, noting the characteristics of the truck, being a collection of parts with pivoted connections, selects and assigns by communication 408, module 401 to tend to the truck. Noting the nature of the gravel load filter 407 by communication 409 selects and assigns module 402 to do the necessary calculations for the load of gravel.

It should be noted as well that the involvement of modules 401 and 402 is not a momentary involvement for just one frame interval. The involvement may be for a period of time until movement ceases, and there is no further need for calculation and rendering of new display states for the objects in question. Further, one involvement may be for a longer period than the other. Filter 407 continues tracking flow of object states, and orchestrating the physics calculations as needed.

It was introduced briefly above that the optimized physics modules are largely independent, but that may occasionally be need for some cross-talk. For example, as a user raises the truck bed to an angle that overcomes friction, the gravel load will begin to slide from the tailgate of the truck as shown in FIG. 2. As the gravel load slides out, the mass of the truck plus load decreases. This change may have an effect on the truck. For example, the truck may be under power and moving forward while the gravel is disbursed. The lesser weight on the truck may cause the truck to accelerate. So in some cases filter 407 may direct module 403 to communicate with module 401 as to the weight of gravel still on the truck, the rate of decrease in weight, and so on.

In embodiments of the invention the different optimized modules are not closely coupled. There is no direct and continuous exchange of data between modules. The modules are loosely coupled, so data exchange is only done if seen by higher authority (filter) to be needed.

Another reason modules may be loosely coupled is that not all modules will operate at the same rate. Modules that operate at different rates cannot be conveniently coupled, and there will need to be synchronization, which may be handled as well by the filter layer in the SW.

It will be apparent to the skilled person that video games at the time of filing the present application may be quite complicated, and populated with a number and variety of objects, vehicles, avatars, weapons, and the like, and may also be multi-player games. The need for physics simulation in such games may be considerable. There may be many more physics simulation modules than those described as examples in this specification, and several modules may be operating with regard to different elements in the virtual world simultaneously. The number and type of modules is exemplary, and the invention is limited only by the claims that follow.

The invention claimed is:

1. A method comprising:
   classifying individual ones of objects in a virtual world provided by software executing from a non-transitory medium on a processor of a network-connected server, into different kinds of objects, including, but not limited to, two or more of humanoid characters, assemblies of parts constrained by pinned rotary joints, liquid, gases, slurries, objects floating in liquid, projectiles, and large heavy objects;
   preparing a specific physics simulation engine optimized to simulate motion for each one of the kinds of objects into which objects in the virtual world are classified;

determining that simulation is required for one of the objects in the virtual world;

calling, from the plurality of specific simulation engines, the specific simulation engine optimized for objects of the kind of object for which it is determined that simulation is required; and applying the specific simulation engine to the state of the object for which it is determined simulation is required, determining any display change for that object.

2. The method of claim 1 further comprising:

continuing to apply the specific physics simulation engine called to the particular object until simulated forces are balanced, indicating no further change in display is needed.

3. The method of claim 1 further comprising:

determining that two or more objects are on point of interaction;

determining the kind of object for each of the two or more objects; and calling and applying the specific physics simulation engines optimized for each of the two or more objects.

4. An apparatus comprising:

a network-connected server having a processor executing software from a non-transitory medium, the causing the apparatus to perform a process comprising:

classifying individual ones of objects in a virtual world provided by software executing from a non-transitory medium on a processor of a network-connected server, into different kinds of objects, including, but not limited to, two or more of humanoid characters, assemblies of parts constrained by pinned rotary joints, liquid, gases, slurries, objects floating in liquid, projectiles, and large heavy objects;

preparing a specific physics simulation engine optimized to simulate motion for each one of the kinds of objects into which objects in the virtual world are classified;

determining that simulation is required for one of the objects in the virtual world;

calling, from the plurality of specific simulation engines, the specific simulation engine optimized for objects of the kind of object for which it is determined that simulation is required; and applying the specific simulation engine to the state of the object for which it is determined simulation is required, determining any display change for that object.

5. The apparatus of claim 4 further comprising:

continuing to apply the specific physics simulation engine called to the particular object until simulated forces are balanced indicating no further change in display is needed.

6. The apparatus of claim 4 further comprising:

determining that two or more objects are on point of interaction;

determining the kind of object for each of the two or more objects; and calling and applying the specific physics simulation engines optimized for each of the two or more objects.

* * * * *